United States Patent
Dean et al.

(10) Patent No.: US 6,445,182 B1
(45) Date of Patent: Sep. 3, 2002

(54) GEOMETRIC DISTORTION CORRECTION IN MAGNETIC RESONANCE IMAGING

(75) Inventors: David Dean, Shaker Heights; Jeffrey L. Duerk, Avon Lake; Janardhan K. Kamath, Willoughby Hills, all of OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 09/673,965

(22) PCT Filed: Apr. 23, 1999

(86) PCT No.: PCT/US99/08726

§ 371 (c)(1),
(2), (4) Date: Feb. 12, 2001

(87) PCT Pub. No.: WO99/56156

PCT Pub. Date: Nov. 4, 1999

Related U.S. Application Data

(60) Provisional application No. 60/083,010, filed on Apr. 24, 1998.

(51) Int. Cl.$^7$ .................................................. G01V 3/00
(52) U.S. Cl. ........................ 324/309; 324/307; 324/318
(58) Field of Search ................................ 324/309, 318, 324/307, 312, 300; 128/653

(56) References Cited

U.S. PATENT DOCUMENTS

| | | | | |
|---|---|---|---|---|
| 5,498,963 A | * | 3/1996 | Schneider et al. | 324/309 |
| 5,545,995 A | * | 8/1996 | Schneider et al. | 324/318 |
| 5,676,673 A | * | 10/1997 | Ferre et al. | 606/130 |

* cited by examiner

*Primary Examiner*—Edward Lefkowitz
*Assistant Examiner*—Brij B. Shrivastav
(74) *Attorney, Agent, or Firm*—Fay, Sharpe, Fagan, Minnich & McKee, LLP

(57) ABSTRACT

A three dimensional (3D) magnetic resonance imaging (MRI) system (100) performs object-induced geometric distortion correction. The MRI system performs (202) a 3D MRI pulse sequence to acquire a first 3D MR image of an examination region containing at least a portion of a subject and performs (202) the 3D MRI pulse sequence a second time to acquire a second 3D MR image of the examination region A computer system (110) computes (210) a voxel error map based on a phase difference between the first and second 3D MR images and corrects (212) voxel positions in one of the 3D MR images in accordance with the voxel error map.

15 Claims, 3 Drawing Sheets

GEOMETRIC DISTORTION CORRECTION IN MAGNETIC RESONANCE IMAGING

This patent application claims the benefit of the Apr. 24, 1998 filing date of U.S. Provisional Application No. 60/083, 010, which is herein incorporated by reference.

TECHNICAL FIELD

The present invention relates generally to the field of magnetic resonance imaging (MRI). More particularly, the present invention relates to the field of geometric distortion correction in MRI.

BACKGROUND ART

Neurosurgical stereotaxis refers to a collection of techniques used to superimpose radiological volume images intra-operatively to the patient's skull, brain, and cerebrovasculature. Typical stereotactic procedures begin with the collection of a three dimensional (3D) computer tomography (CT) image containing fiducial markers. The resulting 3D image space may then be used to determine an optimal craniotomy or skull opening site and to model virtually the potential intra-operative orientation of a surgical tool, such as a biopsy needle for example. Using such images helps reduce the size of the craniotomy and intracranial traverse of surgical tools.

For a typical procedure, a stereotactic frame or frameless fiducial imaging markers are mounted on the patient's head, often by screwing either into the skull. These fiducial markers are then used by a three dimensional (3D) digitizer to register the image-based surgical plan to the patient. Using the fiducials, the region of interest can be mapped to the coordinate system in the pre-operative image. The digitizer can be used to guide the craniotomy and initial insertion of surgical tools virtually from the pre-operative image.

Typical stereotactic surgical procedures emphasize accurate location of anatomical structures within pre-operative images. The accuracy of a neurosurgical navigational system depends on, for example, the mechanical accuracy of the 3D digitizing probe, the image registration algorithm, geometrical distortion of the pre-operative images, movement of the patient during scanning, movement of the patient with respect to the patient space determined with the 3D digitizing system, and movement of the brain between scanning and surgery.

Using CT for stereotactic pre-operative imaging helps ensure relatively high spatial fidelity is obtained between the patient's images and the patient's anatomy in the operative stereotactic guidance device. CT techniques use a beam of high-energy X-ray photons to probe the patient and display an image based on the internal influences on the passage of photons through the patient. CT may be used to generate a series of images containing a distribution of the X-ray attenuation co-efficient, which relates to the electron density of the atoms, of a 3D volume. Such image reconstruction is based on the principles of line-of-sight ray optics. CT therefore provides images of relatively high positional accuracy.

CT is useful in imaging bony structures yet has limited ability to differentiate between components of inhomogeneous soft tissue structures, such as the brain for example. CT is capable of differentiating tissues only insofar as the region of interest's X-ray attenuation coefficient differs from its surroundings. Diverse adjacent soft tissue structures, such as muscles, mucosa, nerves, and blood vessels for example, typically appear as a solid mass when imaged. As CT also involves X-ray exposure, its frequency of use must be limited to avoid tissue burning and genetic damage or mutation, for example, as a result of ionizing radiation overexposure.

Magnetic resonance (MR) is based on the presence of magnetic moments in some nuclei of atoms of the patient or other sample being imaged. The protons in many nuclei behave as tiny bar magnets or magnetic dipoles. In the absence of any external influences, these magnetic dipoles are randomly oriented with zero net magnetization. When placed in an external magnetic field, the nucleus precesses around that field at a gravitational field. The precession frequency, $\omega$, depends on the strength of the external magnetic field $B_0$ as follows:

$$\omega = \gamma B_0 \qquad \text{Equation 1}$$

where $\omega$ is the resonance or Larmor frequency of the nuclei of interest, $\gamma$ is the gyromagnetic ratio of the nuclei of interest, and $B_0$ is the applied magnetic field strength.

In magnetic resonance imaging (MRI), the sample is exposed to a radio frequency (RF) signal of the same precession frequency. The sample absorbs energy and changes its alignment relative to the applied field. Upon removal of the excitation signal, the magnetic dipoles relax and fall back to their original entropic alignment. As this occurs, each material in the sample emits a characteristic resonant frequency which can be detected and measured. The relaxation time required for each tissue sample depends on its proton environment as protons that may pass on the energy to their neighboring atoms with relative ease can return to their original state relatively faster.

MRI maps the proton density distribution weighted by T1 and T2 relaxation effects in the sample. Hydrogen, an abundant element in live tissue, has a nucleus comprising a single proton. Because of the freedom of hydrogen-containing-molecules to precess, MR images of living samples highlight different time dependent development of recovery of magnetization of the heterogeneous soft tissues in such samples.

Typical MRI techniques apply three orthogonal linearly varying magnetic field gradients to the nuclear magnetic dipoles of the sample in the presence of a homogeneous static magnetic field to define the location of the proton density. the sample is divided into consecutive planes or slices. The protons in an image slice can be selectively excited by a combination of a frequency selective pulse and a field gradient perpendicular to the image plane, termed the slice select gradient. The bandwidth of the RF pulse and the amplitude of the slice select gradient determine the thickness of the slice as follows:

$$\Delta z = \frac{BW_{rf}}{\gamma G_z} \qquad \text{Equation 2}$$

where $\Delta z$ is the slice thickness, $BW_{rf}$ is the bandwidth of the RF pulse, and $G_z$, is the slice select gradient. The slice thickness can be reduced by increasing the gradient strength or decreasing the RF bandwidth.

After the slice selection, a second magnetic field gradient can frequency encode the position of the proton density signal in one direction within the plane. The frequency encoding gradient, also known as the read-out gradient, causes the magnetic field to vary linearly from one end of the image plane to the other in the applied direction. As an extension of Equation 1, the precession frequency of the net magnetization vector varies from point to point along this direction as follows:

$$\omega(y)=\gamma(B_0+yG_y) \quad \text{Equation 3}$$

where y is the position along the frequency encoded direction and $G_y$ is the frequency encoding gradient.

The second dimension in the image plane is encoded by phase encoding. Phase of the magnetization vector can be defined as the state of precession of the vector at a given point in time. The application of a third orthogonal gradient, also known as the phase encoding gradient, causes the magnetization vectors in that direction to precess at different frequencies. When the phase encoding gradient is removed after a short time, the vectors precess again at the same frequency although the phase of each vector has been changed in proportion to the applied gradient.

Within a slice plane, the phase encoding gradient and frequency encoding gradient are applied in orthogonal directions resulting in a data matrix of amplitude points. The phase and frequency at point (x,y) are related to their spatial position and gradient strength as follows:

$$\Phi_x=\gamma_x G_x \Delta t_x x \quad \text{Equation 4}$$

where $\Phi_x$ is the phase at point (x,y), $G_x$ is the phase encoding gradient, $\Delta t_x$ is the phase encoding period, and x is the position along the phase encoded direction, and $$\omega_y=\gamma_y G_y y \quad \text{Equation 5}$$

where $\omega_y$ is the frequency at point (x,y), $G_y$ is the frequency encoding gradient, and y is the position along the frequency encoded direction.

For one typical MRI technique, a human subject is placed relative to a magnet that orients the proton magnetic dipoles. A field gradient is imposed along the z-axis in the direction of the main magnetic field such that a narrow plane of protons resonate within a band of frequencies. A phase encoding gradient along the x-axis is activated for a short time during which the dipoles acquire a different phase. A frequency encoding gradient along the y-axis is then activated to frequency encode the positions of the dipoles while a receiver coil is activated to record the signal. Typically, 128, 256, or 512 data points are recorded along the frequency encode axis. As each recorded data point corresponds to a respective pixel in the image to be generated, the number of recorded data points determines the resolution of that image.

A Fourier Transformation (FT) algorithm is used to decode frequency information contained in a proton signal at each location in the imaged plane to corresponding intensity levels. The resulting image is then displayed as shades of gray in a matrix arrangement of pixels.

For 3D FT imaging, slice selection is obviated by simultaneously acquiring data from the entire imaging volume. The slice selection excitation pulse of the 2D imaging technique is replaced by a weaker gradient pulse which is simultaneously recorded from the entire image volume. Partitioning into individual slices is then achieved by stepping an additional phase encoding gradient, analogous to the phase encoding for 2D imaging. This additional gradient is applied orthogonal to the plane defined by the conventional phase and frequency encoding gradients.

As MR radio frequency electromagnetic radiation can penetrate the skull relatively well, MRI may be used for neurosurgery. MRI may be used to image the interior of the cranial vault, for example, without significant attenuation.

In contrast to CT, MRI involves no ionizing radiation and helps provide better definition to inhomogeneous soft tissue structures due to the dependence of the MR signal on nuclear proton density, T1 and T2 relaxation times, and fluid flow through tissue. Through instrument design and operator control, the influence of these parameters on the MR image may be emphasized to better discriminate between tissues having similar density. As one example, gray and white matter may be discriminated on the basis of their significantly different T1 values. As another example, tumor, edema, cerebrospinal fluid, gray matter, and white matter may be contrasted in T2 weighted images.

MRI may also be used to reconstruct images for any standard orientation, such as transverse, coronal, or sagittal slices for example, or for any oblique orientation. CT techniques typically collect images in the axial plane, although spiral-scanned volumes may be reformatted to generate images in other orientations without repositioning the patient within the CT scanner. Some image quality may be lost during such reformatting to avoid more than the minimum X-ray exposure.

Typical MRI techniques generate images having a 256×256 pixel resolution. Higher image resolutions may lead to a lower signal-to-noise ratio (SNR). Typical CT techniques generate images having a 512×512 pixel resolution with relatively good SNR.

Scan time in typical MRI techniques is relatively longer than for an equivalent 3D CT spiral scan. Scan time $T_{scan}$ depends on the repetition time $T_R$, the number of phase encodings $N_y$, and the number of signal acquisitions NSA as follows.

$$T_{scan}=T_R N_y NSA(*N_z \text{ in } 3D) \quad \text{Equation 6}$$

Depending on the chosen acquisition parameters, such as T1, T2, and proton density for example, the scan time $T_{scan}$ can range from seconds to minutes and is typically significantly greater than for an equivalent 3D CT spiral scan. Fast MRI techniques, such as Echo Planar Imaging for example, have been proposed with most having significantly lower SNR. Slower MR scan times increase the likelihood of blood flow and patient motion artefacts.

CT techniques may produce within-plane beam artefacts from dense metal objects while MRI is not suitable for imaging subjects that contain ferrous objects such as dental, cardiac pacemaker, or other common surgical implants.

MRI depends on relatively highly uniform magnetic fields. Any non-uniformity in these magnetic fields manifests as distortion in the reconstructed image. Because an accurate representation of location and size of organ substructures in images is crucial for stereotactic applications, such as multimodality-image-superposition and image-guided-surgery for example, geometric distortions inherent to MRI are to be considered a for such spatially quantitative applications. Geometric distortions in MR images result from non-uniformity introduced into the magnetic field from different sources, such as gradient field non-linearities, chemical shift resonance frequency offsets, and magnetic field inhomogeneity resonance frequency offsets for example.

Typical MRI systems generate gradient magnetic fields with currents passing through three orthogonal coils. Despite the relatively high precision fabrication of the coils, the resulting gradient fields have some residual non-linearity which may manifest differently depending on the imaging method. Gradient field non-linearities manifest in three ways in 2D MRI, as illustrated in FIGS. 2A, 2B, and 2C.

As illustrated in FIG. 2A, a transverse distortion in the slice plane results in a barrel aberration. As illustrated in FIG. 2B, gradient field non-linearities can cause gradual increase in slice thickness as one moves away from the gradient iso-center, resulting in a bow tie effect. As illustrated in FIG. 2C, a gradient field non-linearity in the slice selection direction results in a potato chip effect where the reconstructed image planes are wrapped into potato chip like shapes and may be interpreted as a volume.

Barrel aberration and bow tie distortions may be corrected with suitable mathematical techniques. Correction of the potato chip effect distortion, however, is more complex as the slices are not contiguous in most scans to avoid RF saturation effects.

Distortion in MRI also results due to chemical shift which occurs when materials, perhaps different portions of a single scanned object, appear to have moved relative to each other in an image. Water and fat are two basic types of molecules whose hydrogen atoms give rise to MR signals. Due to the different chemical environments, hydrogen atoms attached to different molecules resonate at slightly different frequencies while in the same applied magnetic field $B_0$. Inhomogeneous shifts between fat and water-rich soft tissue regions, for example, may occur in the image. Selective saturation or selective excitation methods may be used to account for chemical shift. Selective suppression of either fat or water-rich soft tissue regions yields a water-only or fat-only image, respectively. Selective excitation of either fat or water-rich soft tissue regions yields a fat-only or water-only image, respectively. Chemical shift generally does not pose a significant problem for stereotactic neurosurgical localization procedures.

Magnetic field inhomogeneity distortion is more complex as it depends on both the apparatus and the imaged object. Scanner based inhomogeneity can be caused by residual imperfections which cause non-linearities in the generated magnetic field. Shimming is a process whereby appropriate corrective currents are applied in shim coils to restore the homogeneity of the magnetic field. Improvements in magnet technology and shimming techniques have significantly reduced this form of inhomogeneity.

Magnetic field inhomogeneities due to magnetic susceptibility differences in the imaged object, however, present a complex source of geometric distortion error in MR images. Magnetic susceptibility errors are also referred to as object-induced magnetic field inhomogeneities. The materials in a scanned neurosurgical patient's head have different susceptibility to applied magnetic fields and structurally have different proportions and distribution of constituents with differing magnetic susceptibility, especially fat, water, and air/tissue interfaces. The shape of the head and the proportions of these constituents remodel with age and health status and vary from individual to individual. As a result, each case has a different susceptibility error and therefore different geometric distortion due to inhomogeneity in the scanned object's susceptibility to magnetism. This error is likely difficult to correct using only prescan calibration data. Differential susceptible to the magnetic field of materials possibly in the environment around the imaged object also present a source of geometric distortion error in MR images.

Overall, magnetic field inhomogeneities are dependent on the material present in the image volume, the shape of the structure being imaged, and its pose within the $B_0$ field. Like other resonance offsets, such as chemical shift for example, these distortions occur only along the read-out gradient direction. Distortion of this nature occurs in gradient recalled echo and spin echo image sequences. The distortion may be significantly large when a small read-out gradient and a large magnetic field are used as in many stereotactic neurosurgical imaging protocols. Also, these distortions may be significant at interfaces of materials with largely differing magnetic susceptibility, such as the air/scalp, scalp/skull, skull/dura, and gray/white matter interfaces in the head for example.

DISCLOSURE OF INVENTION

In accordance with the present invention, a method corrects a three dimensional (3D) magnetic resonance (MR) image in a 3D magnetic resonance imaging (MRI) system.

For the method, a 3D MRI pulse sequence is performed to acquire a first 3D MR image of an examination region containing at least a portion of a subject. The 3D MRI pulse sequence is performed a second time to acquire a second 3D MR image of the examination region.

In performing the 3D MRI pulse sequence, the examination region may be spatially encoded with a first phase encoding gradient along a first axis in the examination region, a second phase encoding gradient along a second axis in the examination region, and a frequency encoding gradient along a third axis in the examination region. A Fast Low Angle SHot (FLASH) 3D MR-scan protocol may be performed.

A voxel error map is computed based on a phase difference between the first and second 3D MR images. Voxel positions are corrected in one of the 3D MR images in accordance with the voxel error map. A forward warping technique may be performed in correcting the one 3D MR image.

Frameless fiducial markers may be applied to at least a portion of the subject in the examination region for registering the corrected 3D MR image with at least a portion of the subject in the examination region.

Also in accordance with the present invention, a 3D MRI system comprises suitable means for performing the method. The 3D MRI system may comprise a static magnet, pulse sequence apparatus, pulse sequence control apparatus, and a computer system.

The static magnet produces a magnetic field along a predetermined axis relative to at least a portion of a subject in an examination region. The pulse sequence apparatus creates magnetic field gradients in the examination region, applies radio frequency (RF) pulsed magnetic fields in the examination region, and receives RF magnetic resonance (MR) signals from the examination region. The pulse sequence control apparatus controls the pulse sequence apparatus to apply a 3D MRI pulse sequence in the examination region a first time and to apply the 3D MRI pulse sequence in the examination region a second time. The pulse sequence control apparatus may control the pulse sequence apparatus to encode spatially the examination region with a first phase encoding gradient along the predetermined axis in the examination region, a second phase encoding gradient along a second axis in the examination region, and a frequency encoding gradient along a third axis in the examination region. The pulse sequence control apparatus may control the pulse sequence apparatus to perform a Fast Low Angle SHot (FLASH) 3D MR-scan protocol.

The computer system acquires a first 3D MR image from received RF MR signals resulting from the first time application of the 3D MRI pulse sequence in the examination region, acquires a second 3D MR image from received RF MR signals resulting from the second time application of the 3D MRI pulse sequence, computes a voxel error map based on a phase difference between the first and second 3D MR images, and corrects voxel positions in one of the 3D MR images in accordance with the voxel error map. The computer system may perform a forward warping technique in correcting the one 3D MR image.

The MRI system may also comprise frameless fiducial markers applied to at least a portion of the subject in the examination region for registering the corrected 3D MR image with at least a portion of the subject in the examination region.

BRIEF DESCRIPTION OF DRAWINGS

The present invention is illustrated by way of example and not limitation in the figures of the accompanying drawings, in which like references indicate similar elements and in which.

MODE(S) FOR CARRYING OUT THE INVENTION

A three-dimensional (3D) magnetic resonance imaging (MRI) system performs object-induced geometric distortion correction.

Exemplary 3D MRI System

Figure 1:
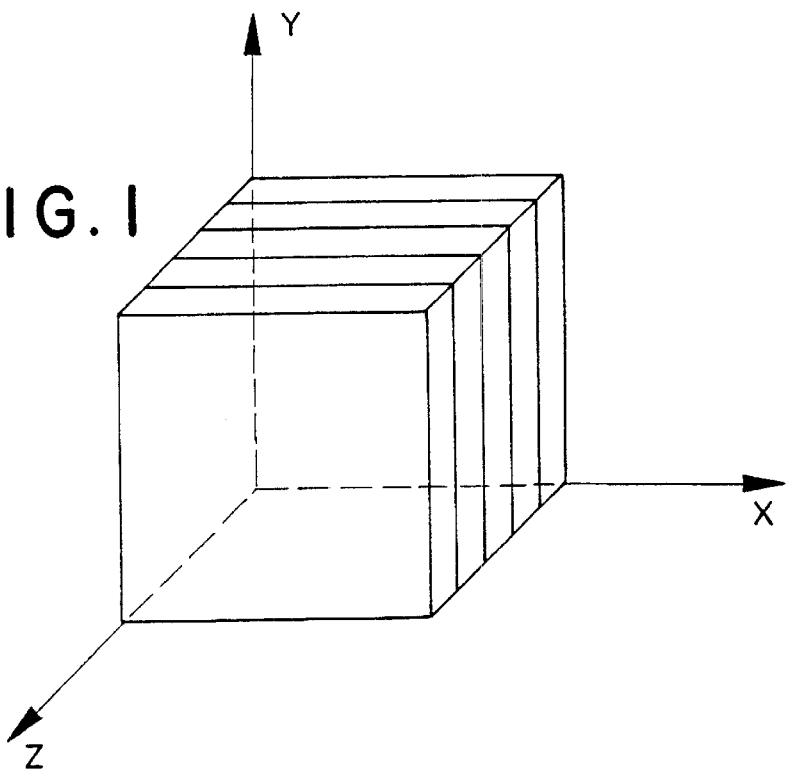
FIG. 1 illustrates directions for image encoding in magnetic resonance imaging (MRI)
Figure 2A:
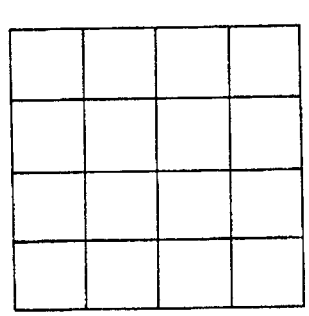
FIG. 2A illustrates barrel aberration in an MR image.
Figure 2A:
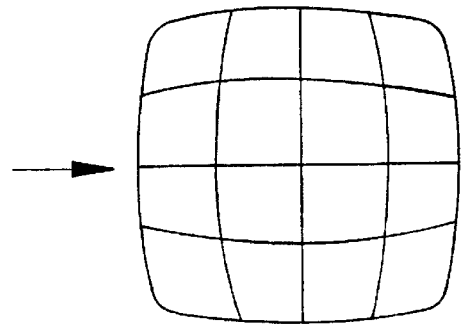
Figure 2B:
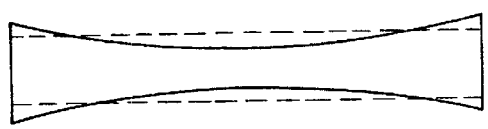
FIG. 2B illustrates bow tie effect distortion in an MR image.
Figure 2C:
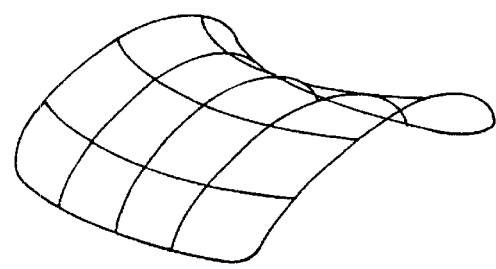
FIG. 2C illustrates potato chip effect distortion in an MR image.
Figure 3:
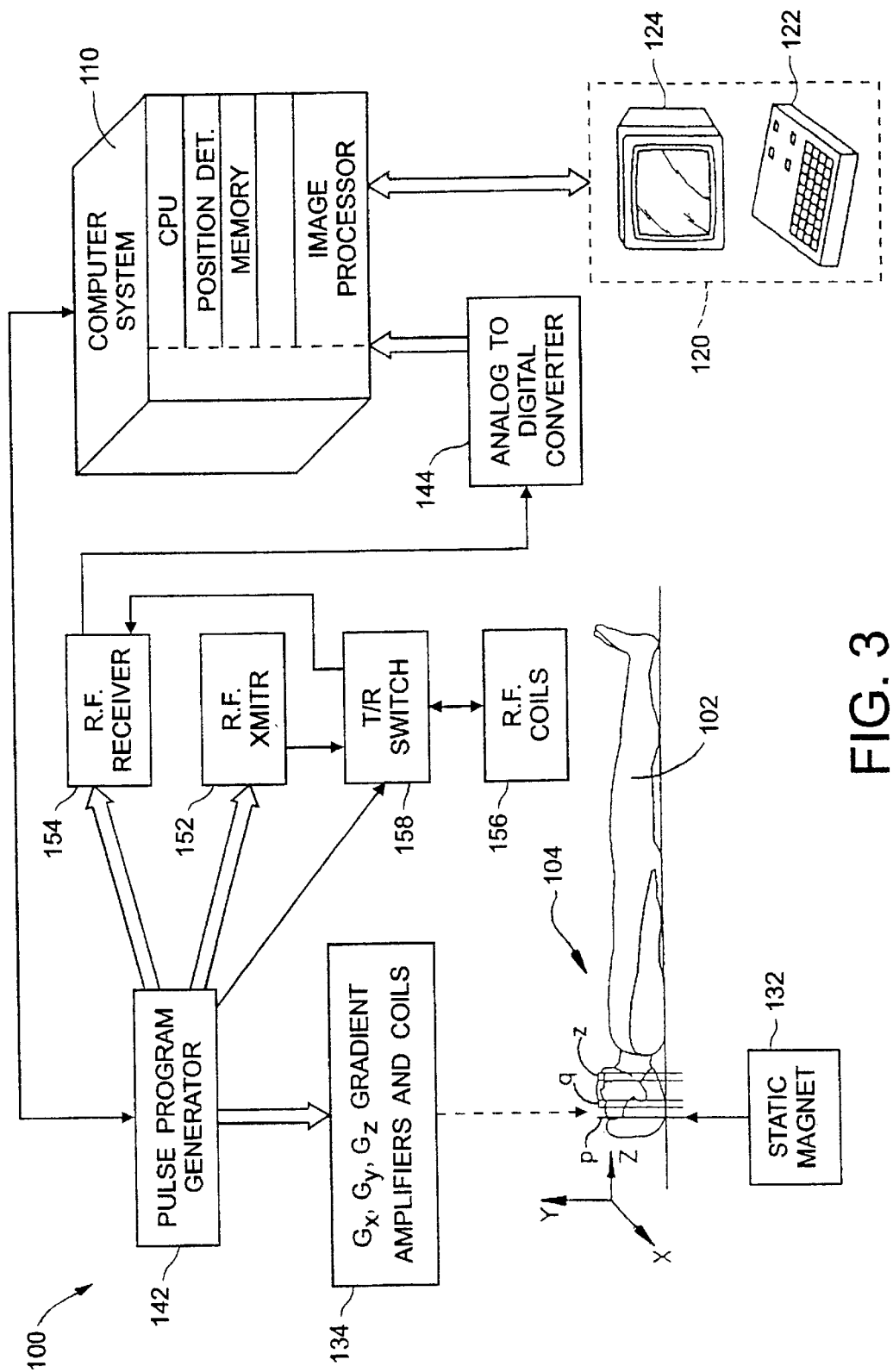
FIG. 3 illustrates in block diagram form an exemplary three-dimensional (3D) MRI system for performing object-induced geometric distortion correction in accordance with the present invention.

FIG. 3 illustrates an exemplary three-dimensional (3D) magnetic resonance imaging (MRI) system 100 for performing object-induced geometric distortion correction in accordance with the present invention.

The operation of 3D MRI system 100 is controlled by a computer system 110. A console 120 comprising a control panel 122 and a display 124 communicates with computer system 110 to enable an operator to control the production and display of 3D MR images on display 124.

To produce images with 3D system 100 at least a portion of a subject 102 of interest is placed within an examination region 104. A static magnet 132 produces a substantially uniform, temporally constant magnetic field $B_0$ along a desired z-axis such that selected nuclear magnetic dipoles of subject 102 within examination region 104 preferentially align with the magnetic field. Although illustrated as a human subject, subject 102 may be an animal subject or any other suitable sample.

Computer system 110 communicates with a pulse program generator 142 to control a set of $G_x$, $G_y$, $G_z$ gradient amplifiers and coils 134, a radio frequency (RF) transmitter 152, and an RF receiver 154 so as to carry out a desired 3D MRI scan sequence.

RF transmitter 152 transmits RF pulses into examination region 104 using RF coils 156 to cause magnetic resonance of the preferentially aligned dipoles of subject 102 within examination region 104. RF receiver 154 receives RF magnetic resonance (MR) signals detected by RF coils 156 from the resonating dipoles of examination region 104. Pulse program generator 142 also controls a transmit/receive (T/R) switch 158 selectively connecting RF transmitter and RF receiver 154 to RF coils 156. Separate transmit and receive RF coils may also be used, obviating any need for T/R switch 158. Computer system 110 comprises an analog-to-digital converter 144 to receive the RF MR signals from RF receiver 154 in digital form and processes the digitized RF MR signals to reconstruct an image representation for display on display 124. Gradient amplifiers and coils 134 impose magnetic field gradients with the static magnetic field along mutually orthogonal x, y, z-axes to spatially encode the received RF MR signals.

As 3D MRI system 100 scans a 3D image volume in examination region 104 in accordance with a 3D MRI pulse sequence, 3D image data of the entire image volume is simultaneously acquired. For one embodiment, a relatively weak gradient pulse is imposed along the z-axis in the direction of magnetic field $B_0$. A phase encoding gradient is then activated along the z-axis to encode contiguous parallel image planes p, q, . . . , z in the 3D image volume. An additional phase encoding gradient is activated along the x-axis for a short time during which the dipoles in the 3D image volume acquire a different phase. A frequency encoding gradient is activated along the y-axis to frequency encode the positions of the dipoles. Each recorded data point of the scanned 3D image volume corresponds to a respective voxel in the 3D image to be generated.

Computer system 110 performs a suitable 3D Fourier Transformation (FT) algorithm to decode frequency information contained in a dipole signal at each recorded data point to corresponding intensity levels. Computer system 110 may then display any desired 2D image in any desired orientation from the reconstructed 3D image data as shades of gray in a matrix arrangement of pixels on display 124.

Computer system 110 loads software or program code defining different 3D MRI pulse sequences into writable control storage areas of pulse program generator 142. Pulse program generator 142 executes program code corresponding to a given 3D MRI pulse sequence to provide suitable signals that control the operation of RF transmitter 152, RF receiver 154, T/R switch 158, and gradient amplifiers and coils 134 and thereby effectuate the given 3D MRI pulse sequence. Computer system 110 can specify and effectuate any suitable 3D MRI pulse sequence for 3D MRI system 110 as desired.

Although described in connection with 3D MRI system 100 as illustrated in FIG. 3, any suitable 3D MRI system may be used. One suitable MRI system for 3D scanning is a 1.5 T Siemens Magnetom Vision scanner.

Object-Induced Geometric Distortion Correction

Ideally, 3D MRI system 100 should maintain an homogeneous magnetic field $B_0$ throughout examination region 104. Because of the magnetic susceptibility differences of subject 102 in examination region 104, however, the magnetic field $B_0$ becomes perturbed. Such perturbations lead to off-resonant frequencies at each voxel of the resulting image, thereby distorting the image. In accordance with the present invention, computer system 110 performs an object-induced geometric distortion correction algorithm to correct geometric distortion due to magnetic field inhomogeneities induced by subject 102 in imaging at least a portion of subject 102 with 3D MRI system 100.

Water and lipid are two major constituents in human and animal subjects, for example, that generate MR signals. An MR spectrum showing a distribution of resonant frequencies of various compounds in an object show that hydrogen atoms attached to water and fat molecules resonate at two distinct frequencies separated by about 205 Hertz (Hz) at $B_0=1.5$ Tesla (T). At a first approximation, then, the MR spectrum may be considered as two impulses in the frequency domain. The MR spectrum $\rho(y,\omega)$ at location y can be characterized as follows:

$$\rho(y,\rho)=\rho_\omega(y)\delta(\omega)m+\rho_f(y)\delta(\omega-\omega_f) \qquad \text{Equation 7}$$

where $\rho_\omega(y)$ and $\rho_f(y)$ are the distributions of water and lipid, respectively, and $\omega_f$ is the chemical shift separation of lipid with respect to water.

Considering the one dimensional case where a line is scanned along the read-out direction y using a Gradient Recalled Echo (GRE) pulse, the shift $\Omega(y)$ in resonant frequency at location y is as follows:

$$\Omega(y)=\gamma B_0\chi(y) \qquad \text{Equation 8}$$

where $\chi(y)$ is the magnetic susceptibility of the material at location y. The shift $\Delta(y)$ that the voxel at location y undergoes is as follows.

$$\Delta(y) = \frac{\Omega(y)}{\gamma G_y} \qquad \text{Equation 9}$$

Extracting this misregistration profile $\Delta(y)$ is therefore helpful for correcting any geometric distortion due to object-induced magnetic field inhomogeneities.

When the pulse sequence is applied, the signal demodulated by water resonant frequency $W_\omega$ at echo time T is given by:

$$s(t,T) = \int\int \rho(y,\omega)e^{j\gamma G_y yt}e^{j[\omega+\Omega(y)](t+T)}e^{-\frac{t+T}{T_2(y)}}dyd\omega \qquad \text{Equation 10}$$

where $T_2(y)$ is the spin-spin relaxation time. Substituting Equation 7 in Equation 10, assuming $t<<T$, yields:

$$s(t,T) = \int p_\omega(y)e^{j\Omega(y)(t+T)}e^{-\frac{T}{T_2(y)}}e^{j\gamma G_y yt}dy + \qquad \text{Equation 11}$$
$$\int p_f(y)e^{j[(\omega_w-\omega_f)(t+T)]}e^{-\frac{T}{T_2(y)}}e^{j\gamma G_y yt}dy$$

or:

$$s(t,T) = \int p_\omega(y)e^{\left[j\Omega(y)-\frac{1}{T_2(y)}\right]T}e^{j\gamma G_y t\left[y+\frac{\Omega(y)}{\gamma G_y}\right]}dy + \qquad \text{Equation 12}$$
$$e^{j\omega_f T}\int p_f(y)e^{\left[j\Omega(y)-\frac{1}{T_2(y)}\right]T}e^{j\gamma G_y t\left[y+\frac{(\omega_\omega-\omega_f)+\Omega(y)}{\gamma G_y}\right]}dy$$

Where $G_y=3.13$ mT/m, the chemical shift $\omega_f/\gamma G_y=1.5$ mm Using Equation 8 and an upper bound for $\chi(y)$ as 9.05 ppm, the magnetic susceptibility distortion $\Omega(y)/\gamma G_y$ is less than 4 mm for $B_0=1.5$ T. As the voxel location y generally satisfies $y>>4$ mm, $\omega_f/\gamma G_y<<y$ and $\Omega(y)/\gamma G_y<<y$. The chemical shift and magnetic susceptibility distortions are therefore negligibly small compared to the voxel location. Therefore:

$$s(t,T) = \int\left[p_\omega(y) + p_f\left(y+\frac{(\omega_\omega-\omega_f)}{\gamma G_y}\right)e^{j(\omega_\omega-\omega_f)T}\right] \qquad \text{Equation 13}$$
$$e^{j\left[\Omega(y)-\frac{1}{T_2(y)}\right]T}e^{j\gamma G_y yt}dy$$

The reconstructed signal in the space-domain is then:

$$p(y,T) = \frac{\gamma G_y}{2\pi}\int s(t,T)e^{-j\gamma G_y yt}dt \qquad \text{Equation 14}$$

or:

$$p(y,T) = \qquad \text{Equation 15}$$
$$\frac{\gamma G_y}{2\pi}\left[p_\omega(y) + p_f(y)e^{-j(\omega_\omega-\omega_f)T}\right]e^{\left[j\Omega(y)-\frac{1}{T_2(y)}\right]T}$$

Using the same equations for an echo time $(T+\Delta T)$ yields:

$$p(y,T+\Delta T) = \qquad \text{Equation 16}$$
$$\frac{\gamma G_y}{2\pi}\left[p_\omega(y) + p_f(y)e^{j\omega_f(T+\Delta T)}\right]e^{\left[j\Omega(y)-\frac{1}{T_2(y)}\right](T+\Delta T)}$$

Choosing $\Delta T$ such that $\omega_f\Delta T=2\pi$ yields:

$$p(y,T+\Delta T) = \qquad \text{Equation 17}$$
$$\frac{\gamma G_y}{2\pi}\left[p_\omega(y) + p_f(y)e^{j\omega_f T}\right]e^{\left[j\Omega(y)-\frac{1}{T_2(y)}\right](T+\Delta T)}$$

This choice of $\Delta T$ brings the fat signal for the echo time $T=\Delta T$ in phase with the fat signal for the echo time T. Dividing Equation 17 by Equation 15 yields:

$$\frac{p(y,T+\Delta T)}{p(y,T)} = e^{j\Delta T\Omega(y)}e^{-\frac{\Delta T}{T_2(y)}} \qquad \text{Equation 18}$$

Considering the amplitude and phase of both sides:

$$T_2(y) = \frac{\Delta T}{\ln\left\|\frac{p(y,T)}{p(y,T+\Delta T)}\right\|} \qquad \text{Equation 19}$$

$$\Omega(y) = \frac{phase\left\{\frac{p(y,T+\Delta T)}{p(y,T)}\right\}}{\Delta T} \qquad \text{Equation 20}$$

Hence, from Equation 9:

$$\Delta(y) = \frac{phase\left\{\frac{p(y,T+\Delta T)}{p(y,T)}\right\}}{\gamma G_y \Delta T} \qquad \text{Equation 21}$$

Equation 21 suggests that a position error profile for the voxels can be obtained by acquiring two scans of the 3D image volume and calculating the phase difference. Knowing this error profile, the voxels in the resulting 3D image data can be shifted to their original locations.

Figure 4:
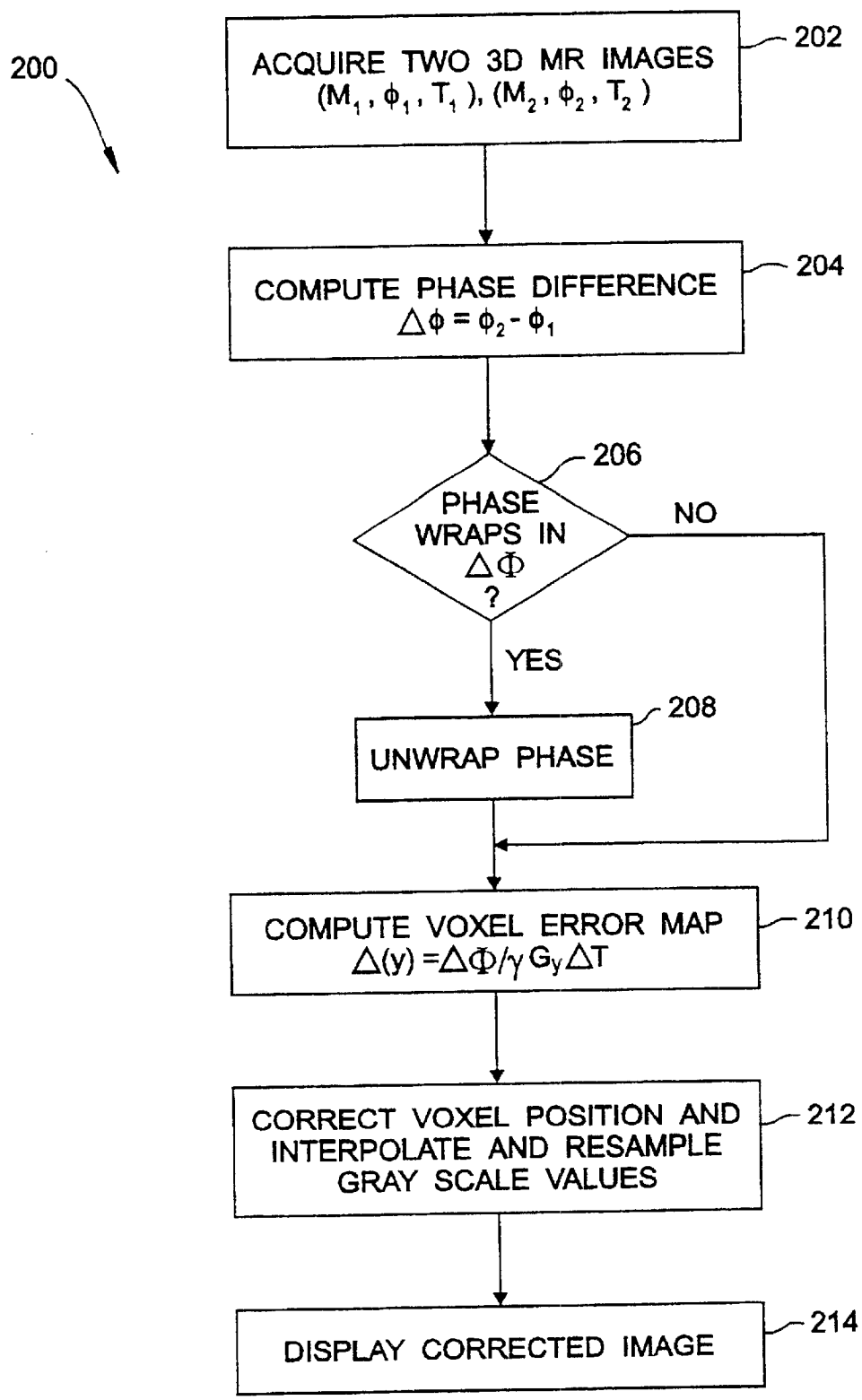
FIG. 4 illustrates, for one embodiment, a flow diagram for correcting object-induced geometric distortion in 3D MRI.

Computer system 110 for one embodiment performs object-induced geometric distortion correction in accordance with flow diagram 200 of FIG. 4.

For step 202 of FIG. 4, 3D MRI system 100 acquires a pair of 3D MR images with similar scan parameters yet with different echo recall times T, where ΔT is the shift in echo recall time T between the two 3D image acquisitions. The off-resonant frequencies at each voxel accrue additional phase in the time interval ΔT. 3D MRI system 100 acquires a pair of 3D anatomical images $M_1$ and $M_2$ and a corresponding pair of respective phase volumes $\phi_1$ and $\phi_2$ at echo recall times $T_1$ and $T_2$.

3D MRI system 100 may perform any suitable imaging protocol to acquire the pair of 3D MR images. One exemplary imaging protocol to acquire the pair of 3D MR images using a 1.5 T Siemens Magnetom Vision scanner is a Fast Low Angle SHot (FLASH) 3D MR-scan protocol to obtain contiguous axial slices of 1 mm thickness with an in-plane resolution of 256×256 pixels, a Field of View (FOV) of 225 mm leading to voxels of 0.89×0.89×1.0 mm, $G_y$=6.52 mT/m, TR=10 ms, tip angle=20°, echo recall times T of 4 and 8.4 ms for the first and second 3D images, respectively, and thus ΔT=4.4 ms. The FOV may be increased to 256 mm to obtain contiguous axial slices of 1.2 mm thickness, sagittal orientation, for another exemplary imaging protocol.

In practice the phase difference between the two scans may exceed $2\pi$ in which case aliasing occurs leading to phase wrapping. Computer system 110 therefore computes the phase difference at each voxel location between the two 3D images for step 204. If the phase difference exceeds $2\pi$ as determined for step 206, computer system 110 for step 208 performs a suitable phase unwrapping technique to determine a suitable phase. As one example, computer system 110 performs a phase unwrapping technique by adding or subtracting multiples of $2\pi$ by tracking the trend of the variation of the phase, as suggested in Schneider, E., Glover, G., "Rapid in-vivo shimming",*Magn. Reson. Med.*, Vol. 18, pp. 335–347 (1991).

Because 3D MRI system 100 scans the 3D image volume in accordance with a 3D MRI pulse sequence, the effects of gradient field non-linearities, such as the potato chip and bow tie effect distortions for example, are significantly reduced as a weak slab select gradient is used to excite the entire image volume simultaneously. Such effects may be further reduced by rapidly acquiring relatively high resolution images, that is with small voxel dimensions, using a relatively small field of view (FOV). Computer system 110 for one embodiment seeks to correct only the geometric distortion resulting from magnetic susceptibility differences and therefore presumes any voxel shifts occur only in the frequency encoding direction as a result of magnetic susceptibility differences. Computer system 110 for step 210 computes a voxel position error map in accordance with Equation 21. Computer system 110 for one embodiment computes error only for voxels above a predetermined voxel intensity threshold to eliminate contributions from background noise, such as random noise and static field inhomogeneity for example.

Computer system 110 then effectuates correction of one of the acquired 3D anatomical images for step 212 by shifting the voxels in that image to their correct locations in accordance with the voxel error map followed by an interpolation and resampling of gray scale values. Computer system 110 for one embodiment computes a voxel error map for correction by forward interpolation through the 3D imaged volume, that is by forward warping, accounting for sub-voxel size shifts in voxel position. Fractional contributions of gray levels from all neighboring voxels of the original 3D image are determined for each voxel position in the corrected 3D image data. Gray scale values across the 3D imaged volume are interpolated and resampled.

For step 214, computer system 110 may then display on display 124 any desired 2D image in any desired orientation from the corrected 3D image data.

3D MRI system 100 may be used for frameless stereotactic neurosurgical procedures. Although significant object-induced geometric distortions are typically encountered at the skin/air and scalp/skull interfaces, where frameless fiducial markers are commonly applied, the voxel-level correction of such object-induced geometric distortions by 3D MRI system 100 allows for better registration of the corrected 3D MR image with at least a portion of the subject in examination region 104.

Although described as being determined by computer system 110, any suitable computer system, such as a personal computer for example, may be used to perform object-induced geometric distortion correction. As one example, a separate computer system may be connected to computer system 110 and programmed to perform object-induced geometric distortion correction based on image information transmitted from computer system 110.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for correcting object-induced distortion in a three dimensional (3D) magnetic resonance (MR) image in a 3D magnetic resonance imaging (MRI) system, the method comprising the steps of:

(a) performing a 3D MRI pulse sequence to acquire a first 3D MR image of an examination region containing at least a portion of a subject;

(b) performing the 3D MRI pulse sequence a second time to acquire a second 3D MR image of the examination region;

(c) computing a voxel error map based on a phase difference between the first and second 3D MR images; and (d) correcting voxel positions in one of the 3D MR images in accordance with the voxel error map to correct object-induced distortion due to the varying magnetic susceptibility of the subject.

2. The method of claim 1, wherein the performing steps (a) and (b) each comprise the step of spatially encoding the examination region with a first phase encoding gradient along a first axis in the examination region, a second phase encoding gradient along a second axis in the examination region, and a frequency encoding gradient along a third axis in the examination region.

3. The method of claim 1, wherein the performing steps (a) and (b) each comprise the step of performing a Fast Low Angle SHot (FLASH) 3D MR-scan protocol.

4. The method of claim 1, wherein the correcting step (d) comprises the step of performing a forward warping technique on the one 3D MR image.

5. The method of claim 1, comprising the step of applying frameless fiducial markers to at least a portion of the subject in the examination region for registering the corrected 3D MR image with at least a portion of the subject in the examination region.

6. A three-dimensional (3D) magnetic resonance imaging (MRI) system comprising:

(a) 3D MRI means for performing a 3D MRI pulse sequence to acquire a first 3D MR image of an examination region containing at least a portion of a subject and for performing the 3D MRI pulse sequence a second time to acquire a second 3D MR image of the examination region;

(b) means for computing a voxel error map based on a phase difference between the first and second 3D MR images; and (c) means for correcting voxel positions in one of the 3D MR images in accordance with the voxel error map to correct objected-induced distortion due to the varying magnetic susceptibility of the subject.

7. The 3D MRI system of claim 6, wherein the 3D MRI means comprises means for spatially encoding the examination region with a first phase encoding gradient along a first axis in the examination region, a second phase encoding gradient along a second axis in the examination region, and a frequency encoding gradient along a third axis in the examination region.

8. The 3D MRI system of claim 6, wherein the 3D I means comprises means for performing a Fast Low Angle SHot (FLASH) 3D MR-scan protocol.

9. The 3D MR l system of claim 6, wherein the correcting means comprises means for performing a forward warping technique on the one 3D MR image.

10. The 3D MRI system of claim 6, comprising frameless fiducial markers applied to at least a portion of the subject in the examination region for registering the corrected 3D MR image with at least a portion of the subject in the examination region.

11. A three dimensional (3D) magnetic resonance imaging (MRI) system comprising:

a static magnet for producing a magnetic field along a predetermined axis relative to at least a portion of a subject in an examination region;

pulse sequence apparatus for creating magnetic field gradients in the examination region, for applying radio frequency (RF) pulsed magnetic fields in the examination region, and for receiving RF magnetic resonance (MR) signals from the examination region;

pulse sequence control apparatus for controlling the pulse sequence apparatus to apply a 3D MRI pulse sequence in the examination region a first time and to apply the 3D MRI pulse sequence in the examination region a second time; and a computer system for acquiring a first 3D MR image from received RF MR signals resulting from the first time application of the 3D MRI pulse sequence in the examination region, for acquiring a second 3D MR image from received RF MR signals resulting from the second time application of the 3D MRI pulse sequence, for computing a voxel error map based on a phase difference between the first and second 3D MR images, and for correcting voxel positions in one of the 3D MR images in accordance with the voxel error map to correct objected-induced distortion due to the varying magnetic susceptibility of the subject.

12. The 3D MRI system of claim 11, wherein the pulse sequence control apparatus controls the pulse sequence apparatus to encode spatially the examination region with a first phase encoding gradient along the predetermined axis in the examination region, a second phase encoding gradient along a second axis in the examination region, and a frequency encoding gradient along a third axis in the examination region.

13. The 3D MRI system of claim 11, wherein the pulse sequence control apparatus controls the pulse sequence apparatus to perform a Fast Low Angle SHot (FLASH) 3D MR-scan protocol.

14. The 3D MRI system of claim 11, wherein the computer system performs a forward warping technique on the one 3D MR image.

15. The 3D MRI system of claim 11, comprising frameless fiducial markers applied to at least a portion of the subject in the examination region for registering the corrected 3D MR image with at least a portion of the subject in the examination region.

* * * * *